(12) United States Patent
Notermans et al.

(10) Patent No.: US 9,385,115 B2
(45) Date of Patent: Jul. 5, 2016

(54) ELECTROSTATIC DISCHARGE PROTECTION DEVICE

(71) Applicant: NXP B.V., Eindhoven (NL)

(72) Inventors: Godfried Henricus Josephus Notermans, Hamburg (DE); Hans-Martin Ritter, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/848,003

(22) Filed: Sep. 8, 2015

(65) Prior Publication Data

US 2016/0104700 A1 Apr. 14, 2016

(30) Foreign Application Priority Data

Oct. 8, 2014 (EP) .................................... 14188198

(51) Int. Cl.
| | |
|---|---|
| *H01L 29/74* | (2006.01) |
| *H01L 27/02* | (2006.01) |
| *H01L 27/06* | (2006.01) |
| *H01L 29/87* | (2006.01) |
| *H01L 29/06* | (2006.01) |

(52) U.S. Cl.
CPC .......... *H01L 27/0255* (2013.01); *H01L 27/067* (2013.01); *H01L 29/87* (2013.01); *H01L 29/0626* (2013.01); *H01L 29/7416* (2013.01); *H01L 29/7436* (2013.01)

(58) Field of Classification Search
CPC .......................... H01L 27/0255; H01L 27/067
See application file for complete search history.

(56) References Cited

U.S. PATENT DOCUMENTS

| | | | |
|---|---|---|---|
| 2006/0097321 | A1 | 5/2006 | Kim |
| 2011/0304944 | A1 | 12/2011 | Salcedo et al. |
| 2014/0138735 | A1 | 5/2014 | Clarke et al. |
| 2014/0167104 | A1* | 6/2014 | Salcedo .................. H01L 29/78 257/140 |

FOREIGN PATENT DOCUMENTS

KR   10-2004-0082832 A   9/2004

OTHER PUBLICATIONS

Sze, S.M. "The Physics of Semiconductor Devices", Chapter 4—Thyristors, $2^{nd}$ edition, John Wiley & sons, New York, 13 pgs. (1981).
Extended European Search Report for EP Patent Appln. No. 14188198.7 (Feb. 5, 2015).

* cited by examiner

*Primary Examiner* — Roy Potter
*Assistant Examiner* — Paul Patton

(57) ABSTRACT

The present disclosure relates to an electrostatic discharge (ESD) protection device. The electrostatic discharge protection device, may comprise: a semiconductor controlled rectifier; and a p-n diode. The semiconductor controlled rectifier and the diode may be integrally disposed laterally at a major surface of a semiconductor substrate; and a current path for the semiconductor controlled rectifier may be separate from a current path for the diode.

13 Claims, 9 Drawing Sheets

Fig 9-1
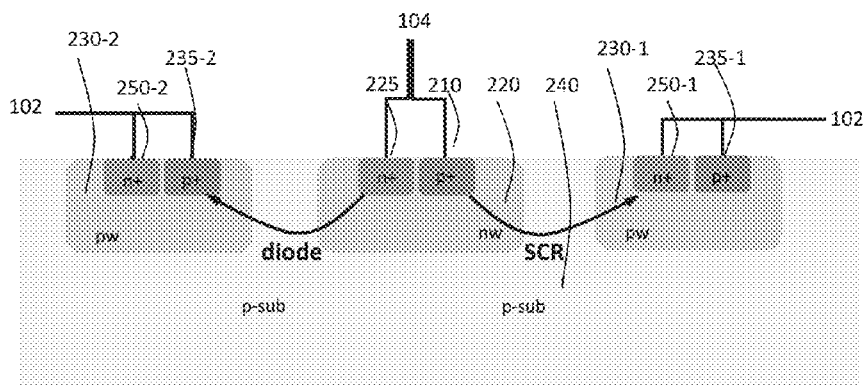
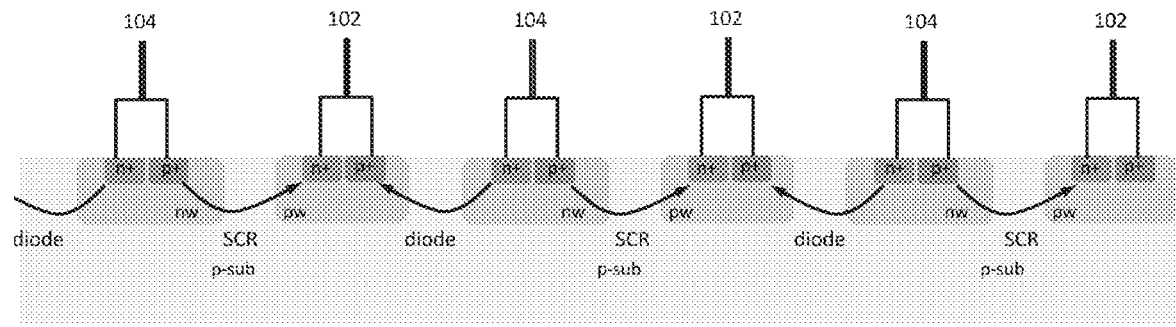
Fig 9-2

ELECTROSTATIC DISCHARGE PROTECTION DEVICE

CROSS-REFERENCE TO RELATED APPLICATIONS

This application claims the priority under 35 U.S.C. §119 of European patent application no. 14188198.7, filed on Oct. 8, 2014, the contents of which are incorporated by reference herein.

The present disclosure relates to a semiconductor electrostatic discharge protection device. In particular the present disclosure relates to an array of such electrostatic discharge protection devices. More particularly the present disclosure relates to data transfer line or data interface comprising such an electrostatic discharge protection device or an array of such electrostatic discharge protection devices.

Electrical surges such as electrical overstress or electrostatic discharge (ESD) transient pulses are common causes of damage to electronic devices. To protect against such transient surges, electronic devices are conventionally protected by surge or ESD protection devices. Such devices provide protection against electrical overstress or electrostatic discharges and are commonly used in portable/consumer electronic devices such as personal computers, audio and video equipment or mobile telephones. Such devices may also be used in data transfer lines or data interfaces used in such portable/consumer electronic devices. According to the International Electrotechnical Commission standard IEC 61000-4-2 (also known as the "gun test") such devices should be protected against system level ESD stresses up to 8 kV.

Original equipment manufacturers (OEMs) of portable/consumer electronic devices have however started to require protection up to 15 kV discharge. To achieve the increased protection levels, ESD devices may simply be made larger. However, larger devices result in increased device capacitance. Portable/consumer electronic devices must be adequately protected from ESD events in accordance with the IEC standards whilst not hampering normal operation of the device. In applications with high speed interfaces such as Universal Serial Bus (USB) or High Definition Multimedia Interface (HDMI) it is necessary that ESD devices have low device capacitance so that signal integrity along the data transfer line or at the data interface is maintained.

It is known to use so-called semiconductor controlled rectifiers (SCRs) and diodes as the basis for ESD devices.

Embodiments relate to semiconductor electrostatic discharge protection devices, comprising: a semiconductor controlled rectifier; and a p-n diode; wherein the semiconductor controlled rectifier and the diode are integrally arranged laterally at a major surface of a semiconductor substrate; and wherein a current path for the semiconductor controlled rectifier is separate from a current path for the diode.

The semiconductor controlled rectifier may comprise first and second transistors of opposite type, wherein: a base and an emitter of the first transistor are arranged as a first input; a base and emitter of the second transistor are arranged as a second input; and the diode is connected between the first and second inputs.

The diode may be arranged between the base of the first transistor and the base of the second transistor.

The semiconductor controlled rectifier may comprise a first semiconductor region having a first conductivity type and a second semiconductor region having a second conductivity type opposite to the first conductivity type; and wherein the p-n diode comprises the second semiconductor region and a third semiconductor region having a first conductivity type.

First semiconductor region, second semiconductor region and third semiconductor region may each comprise respective first and second doped regions of opposite conductivity type.

The p-n diode comprises a first doped region of the third semiconductor region and a second doped region of the second semiconductor region.

The respective first and second doped regions of the first semiconductor region and the respective first and third doped regions of the third semiconductor region may comprise the first input, and the respective first and second doped regions of the second semiconductor region may comprise the second input.

Embodiments may relate to an array of semiconductor electrostatic discharge protection devices, which may comprise an alternating array of semiconductor controlled rectifiers and diodes integrally laterally arranged on a substrate.

Embodiments may relate to an array of semiconductor electrostatic discharge protection devices, wherein the array comprises a lateral arrangement of first and second semiconductor regions of opposing conductivity.

Respective first and second doped regions of the first semiconductor regions may form a first input terminal of the array, and the respective first and second doped regions of the second semiconductor regions may form a second input terminal of the array.

The semiconductor controlled rectifiers may further comprise low voltage trigger implants or diffusions.

A data transfer line may comprise an electrostatic discharge protection device according to embodiments or an array of electrostatic discharge protection devices according to embodiments.

A data interface comprising an electrostatic discharge protection device according to embodiments or an array of electrostatic discharge protection devices according to embodiments.

In the figures and the following description like reference numerals refer to like features. Embodiments will be described further hereinafter by way of example only with reference to the accompanying drawings, in which:

FIG. 2-1 shows a schematic cross-section of the SCR and p-n diode ESD protection device of the type shown in FIG. 1;

FIG. 2-2 shows a schematic cross-sectional structure of any array of ESD protection devices of FIG. 2-1;

FIGS. 3-1 shows the current path for the SCR of an ESD protection device;

FIG. 3-2 shows the current paths for the SCRs in an array of ESD protection devices;

FIG. 4-1 shows the current path for the diode of an ESD protection device;

FIG. 4-2 shows the current paths for the diodes in an array of ESD protection devices;

FIG. 5-1 shows the shared current paths for the SCR and the diode of an ESD protection device;

FIG. 5-2 shows the shared current paths for the SCRs and the diodes in an array of ESD protection devices;

Figure 1:
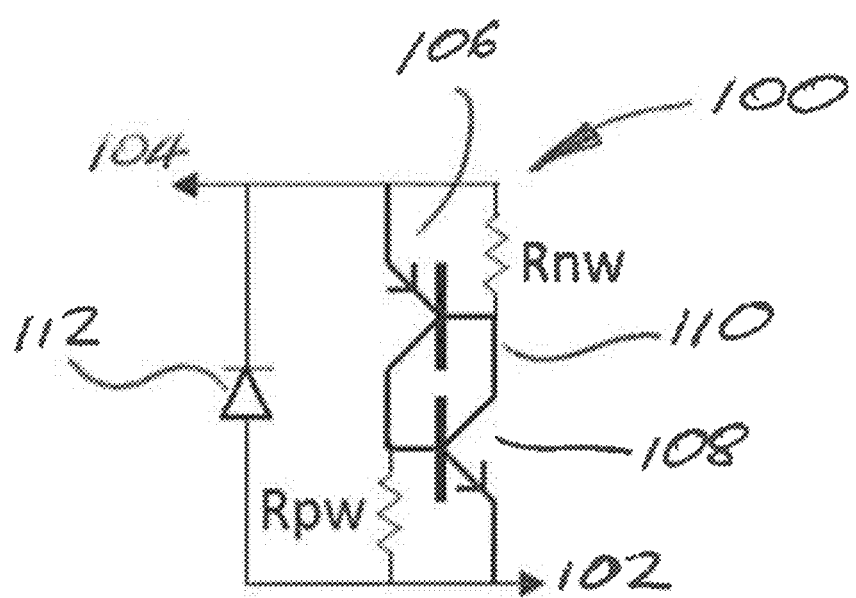
FIG. 1 shows an equivalent circuit diagram of an SCR and p-n diode ESD protection device.
Figures 1, 2:
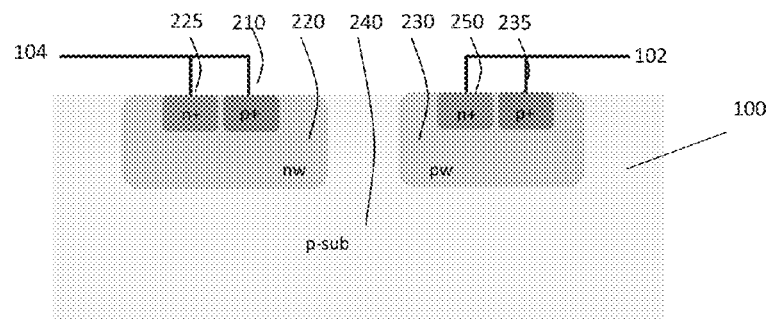
Figure 2:
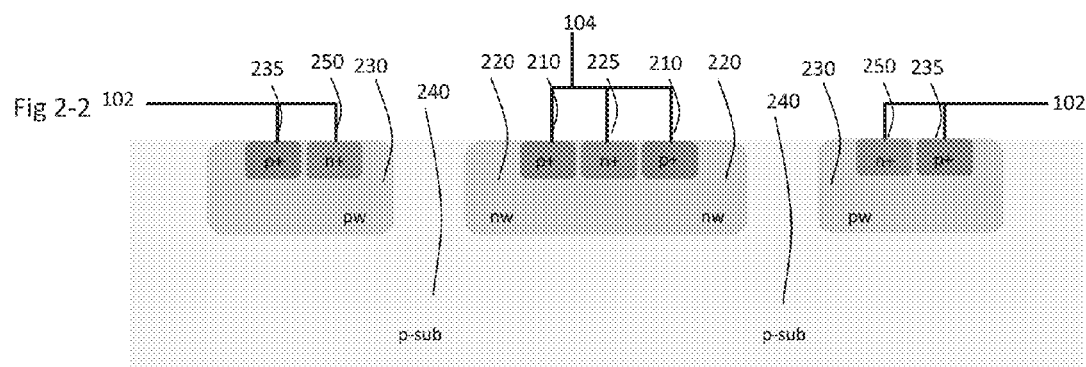
Figures 1, 6:
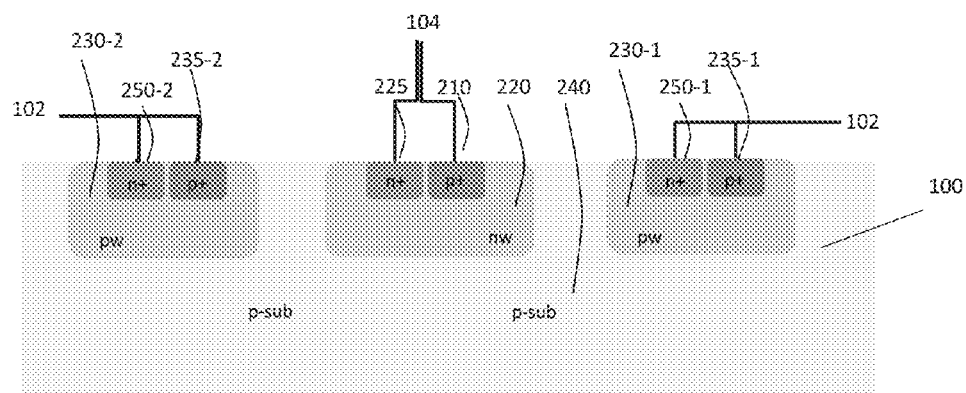
Figures 2, 6:
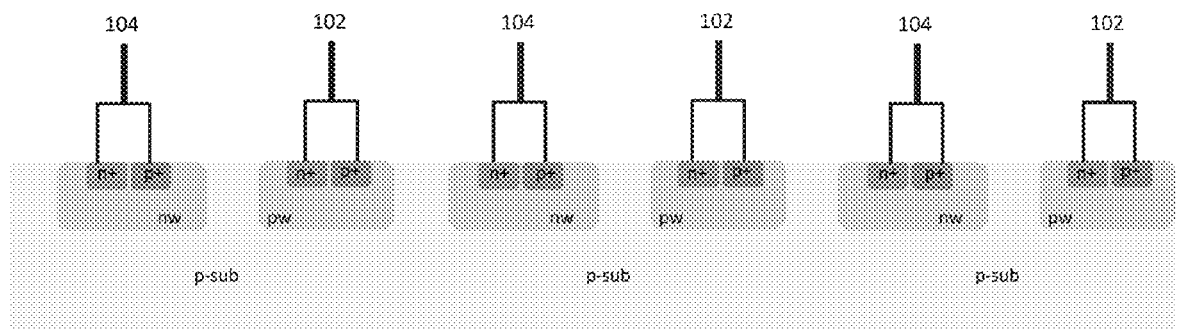
Figures 1, 7:
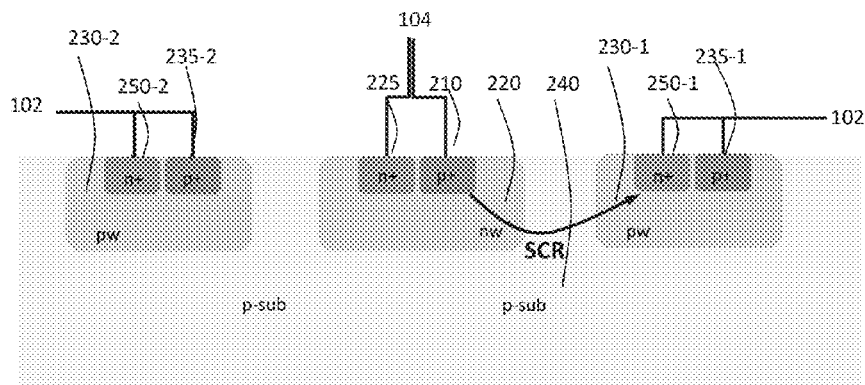
Figures 2, 7:
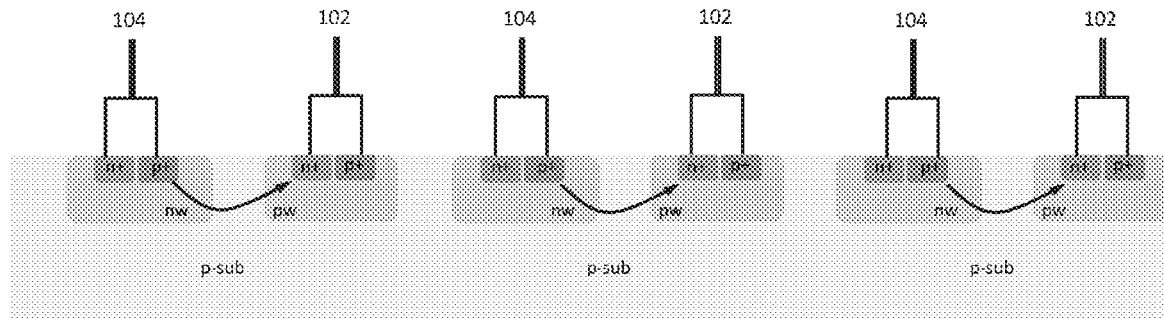
Figures 1, 8:
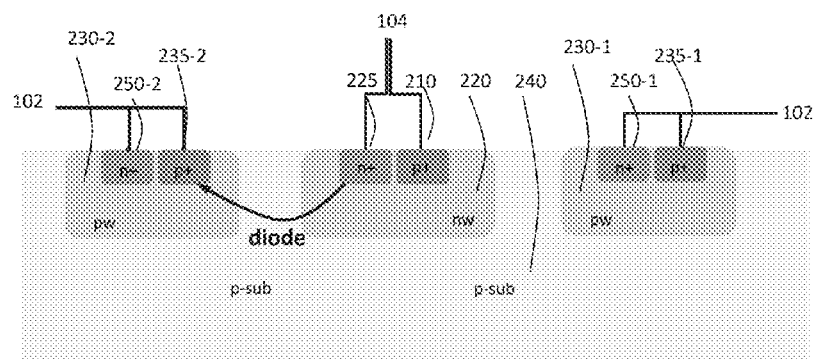
Figures 2, 8:
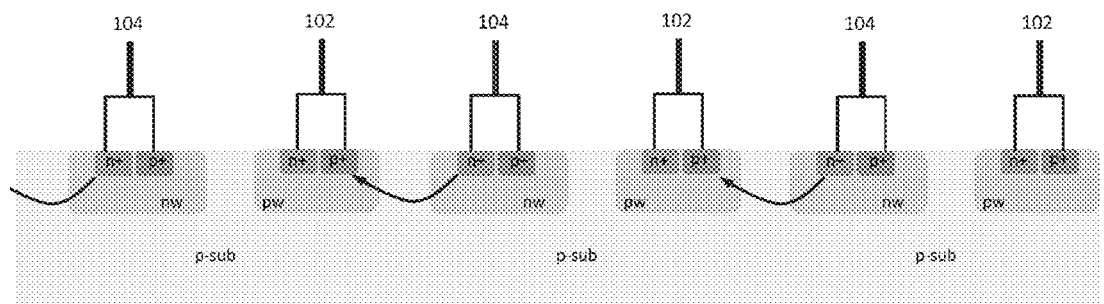

FIG. 6-1 illustrates a schematic cross-section of the SCR and p-n diode ESD protection device FIG. 6-2 illustrates a schematic cross-section of an array of SCRs and p-n diodes forming an array of ESD protection devices FIG. 7-1 illustrates the current path for the SCR of an ESD protection device FIG. 7-2 illustrates the current path for the SCRs of an array of ESD protection device FIG. 8-1 illustrates the current path for the diode of an ESD protection device;

FIG. 8-2 illustrates the current path for the diodes of an array of ESD protection device;

FIG. 9-1 illustrates the separate current paths for the SCR and the diode of an ESD protection device; and FIG. 9-2 illustrates the separate current paths for the SCRs and the diodes in an array of ESD protection devices.

An equivalent of circuit of an ESD protection device 100 is shown in FIG. 1. In overview, the ESD protection device 100 may comprise a signal terminal 104 and a ground terminal 102. The ESD protection device 100 may effectively be regarded as an arrangement of a p-n-p transistor 106 connected to an n-p-n transistor 108, forming an SCR 110, with a p-n diode 112 connected across this arrangement, as discussed further below.

A collector of the p-n-p transistor 106 may be connected to a base of the n-p-n transistor 108, and a base of the p-n-p transistor 106 may be connected to a collector of the n-p-n transistor 108. In this way the ESD protection device 100 may be considered to comprise a silicon controlled rectifier (SCR) 110. An emitter of the n-p-n transistor 108 may form the ground terminal 102 of the ESD protection device 100 and an emitter of the p-n-p transistor 106 may form the signal terminal 104 of the ESD protection device 100. A p-n diode 112, also known as a back-diode, may be connected across the signal terminal 104 and the ground terminal 102. Rnw and Rpw are the spreading resistances of respective n type and p type wells, discussed below. FIG. 2-1 shows a schematic cross-sectional structure of the ESD device 100, comprising the SCR 110 and the p-n diode 112 shown in the circuit diagram of FIG. 1. The ESD device 100 may be formed in a p-type substrate 240 having an n type well region (nw) 220 formed therein. A p+ type diffusion region 210 and an n+ type diffusion region 225 may be formed in the n type well region 220. A p type well region (pw) 230 may also be formed in the p type substrate 240. A n+ diffusion region 250 and a p+ diffusion region 235 may be formed in the p type well region 230. FIG. 2-2 shows a schematic cross-sectional structure of any array of ESD devices 100 shown in FIG. 2-1.

Following the schematic cross-sectional structures of FIGS. 2-1 and 2-2, and the circuit diagram of FIG. 1, the SCR 110 may be considered to consist of four laterally arranged layers of alternating n and p type semiconductor materials to form an p-n-p-n structure. An emitter of the p-n-p transistor 106 may be formed by the p+ type diffusion region 210, a base of the the p-n-p transistor 106 may be formed by the n type well region (nw) 220 and collector of the the p-n-p transistor 106 may be formed by the p type well region (pw) 230 and the p+ diffusion region 235. The base of the p-n-p transistor 106 is contacted via the n+ diffusion region 225. An emitter of the n-p-n transistor 108 may be formed by the n+ diffusion region 250, a base of the n-p-n transistor 108 may be formed by the p type well region (pw) 230 and the p type substrate 240. A collector of the n-p-n transistor 108 may be formed by the n type well region (nw) 220 and the n+ type diffusion region 225. The base of the n-p-n transistor 108 is contacted via the p+ region 235. In this regard, the skilled person will recognise that the n type well region (nw) 220 may be shared by, and may integrally form both a base of the p-n-p transistor 106 and a collector of the n-p-n transistor 108. The skilled person will also recognise that the p type well region 230 may be shared by, and may integrally form both a collector of the p-n-p transistor 106 and a base n-p-n transistor 108. As such certain layers of the p-n-p-n layers may be shared between the p-n-p transistor 106 and the n-p-n transistor 108.

The p-n diode 112 of the ESD device 100 may be formed by the p+ type diffusion region 235 formed in the p type well region (pw) 230 and the p type substrate 240, which may form an anode of the p-n diode 112, and a n+ type diffusion region 225 formed in the n type well region (nw) 220, which may form an cathode of the p-n diode 112. In this way the p-n diode 112 may be integrally formed with SCR 110 in the substrate 240. P+ diffusion region 235 may serve both as base contact for the n-p-n transistor 108 and as anode of the p-n diode 112. P+ diffusion region 235 formed in the p-type well region (pw) 230 may be connected to n+ diffusion region 250, to form an ground terminal 102 of the ESD device 110. N+ diffusion region 225 may serve both as base contact for the p-n-p transistor 106 and as cathode of the p-n diode 112. N+ diffusion region 225 formed in the n-type well region 220 may be connected to p+ diffusion region 210, to form signal terminal 104 of the ESD device. The skilled person will see therefore that the current paths for the SCR 110 and the diode 112 are shared, as also illustrated in FIGS. 5-1 and 5-2.

Figures 1, 3:
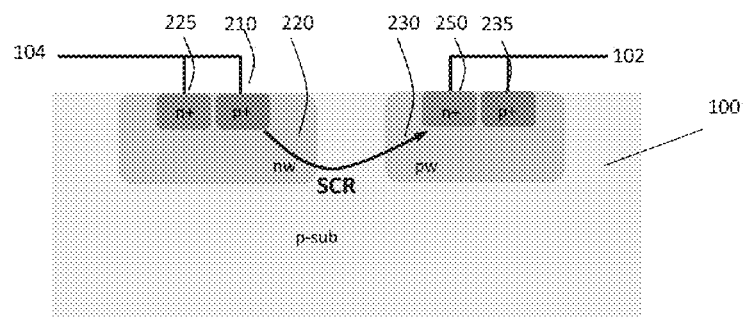
Figures 2, 3:
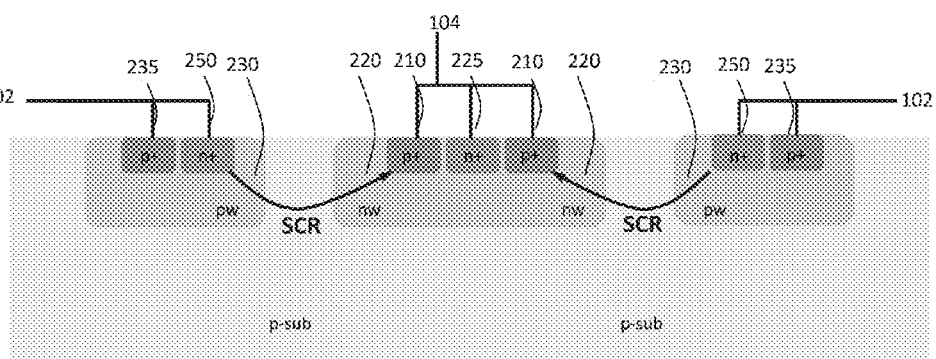

The SCR 110 may be activated by a positive stress voltage, which may be caused by an ESD event, with respect to the ground terminal 102, on the signal terminal 104. Current may flow from p+ diffusion region 210 to n+ diffusion region 250, as shown in FIGS. 3-1 and 3-2. In this way the excessive current on terminal 104 may be drained to ground and the voltage on the signal terminal 104 may be limited in that way protecting any external device that is connected to terminal 104 from overvoltage and overcurrent caused by the positive ESD event. In this context, voltage is limited to the clamping voltage of the ESD protection device 100. The clamping voltage may be considered as the sum of the snap-back voltage, as opposed to the breakdown voltage, of the SCR 110 and the voltage drop caused by the current flowing through the device and the on-resistance of the device. The clamping voltage may be chosen such that it is lower than the critical voltage that would damage the system to be protected.

Figures 1, 4:
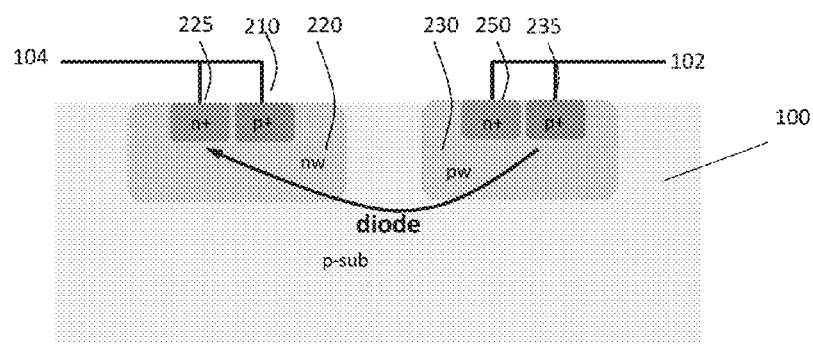
Figures 2, 4:
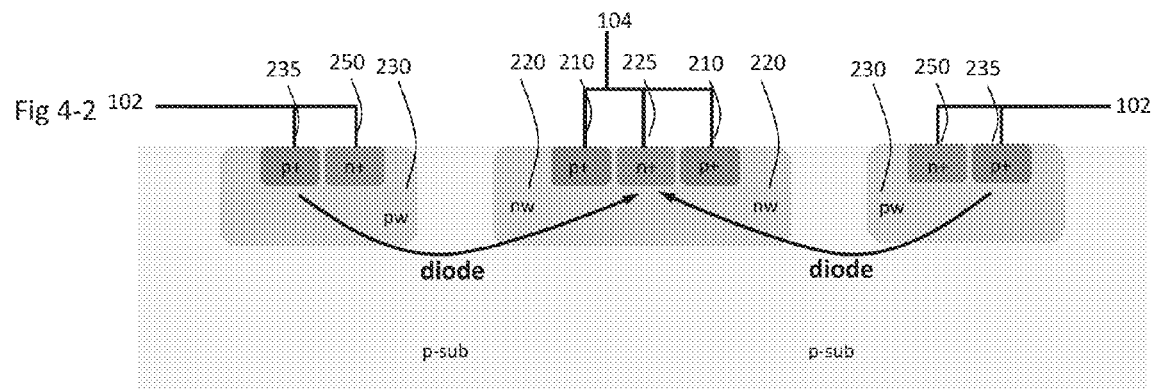

For a negative stress voltage, which may be caused by an ESD event on the signal terminal 104, with respect to the ground terminal 102, the ESD device 100 operates as a p-n diode between the p+ diffusion region 235 formed in the p type well region (pw) 230, and the n+ diffusion region 225 formed in the n type well region (nw) 220. Current may flow from p+ diffusion region 235 to n+ diffusion region 225, as depicted in FIGS. 4-1 and 4-2. In that way the excessive current from the ESD event on terminal 104 may be drained to ground and the voltage on terminal 104 is limited, in that way protecting any external device that is connected to terminal 104 from overvoltage and overcurrent caused by the negative ESD event.

Figures 1, 5:
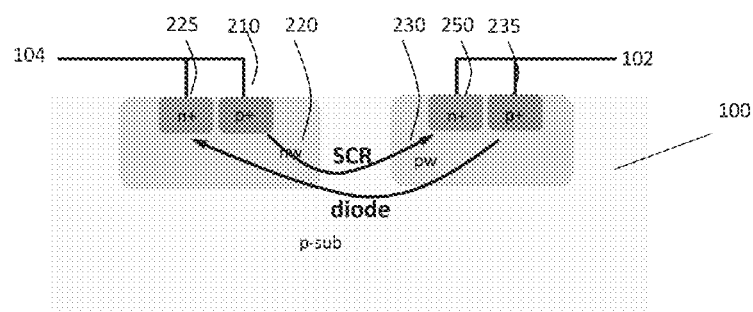
Figures 2, 5:
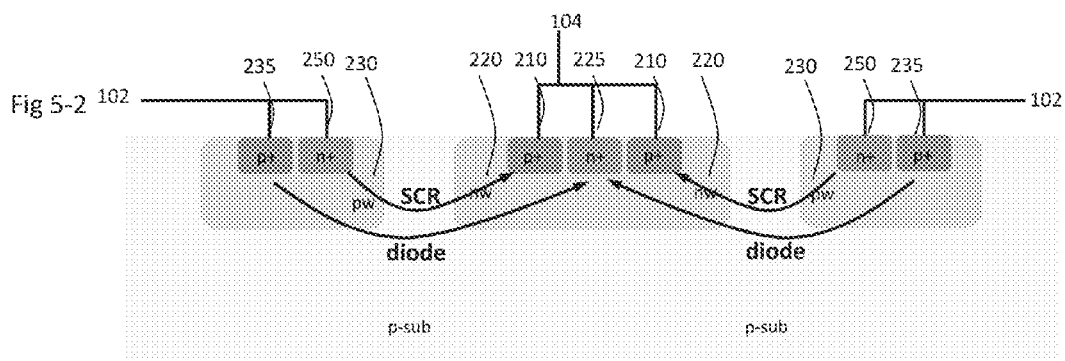

FIGS. 5-1 and 5-2 show that the SCR 110 and the p-n diode 112 share current paths. FIGS. 5-1 and 5-2 are an overlay of FIGS. 3-1, 3-2 and 4-1, 4-2, showing at the current path for positive stress voltages when the SCR is conducting or active, and the current path for negative stress voltage when the diode is conducting or active.

ESD performance, also known as ESD strength or robustness, refers to the ability of an ESD device to withstand increasing ESD currents (typically pulses with a width in the 100 ns range) until thermal damage of the ESD device occurs. The ESD performance can be expressed in terms of the so-called second breakdown current It2, which refers to Transient Line Pulsing (TLP) testing, or alternatively in kilovolts (kV) of an applied ESD event, which refers to IEC "gun test". Second breakdown current, also known as current to fail It2, is the current at which the temperature in the device exceeds the silicon melting temperature of 1414 degrees Celsius.

The robustness of the p-n diode 112 may be much lower than the robustness of the SCR 110. In order to achieve a particular robustness level for both polarities of ESD event, for example, It2>30 A or ESD>15 kV both for positive and negative stress pulses, the entire device may have to be enlarged so that the diode fulfills the robustness requirement. However, as a result of this enlargement the SCR may be larger than necessary and as a consequence the total capacitance of the ESD device may be increased.

There may be certain applications where a combination of SCR and p-n diode with similar robustness is required.

Referring to FIGS. 6-1 and 6-2, a cross-section of the ESD device 100 according to an embodiment is illustrated. The ESD protection device 100 may formed on a p-type substrate 240 having an n type well region (nw) 220 formed therein. A p+ type diffusion region 210 and an n+ type diffusion region 225 may be formed in the n type well region 220. A first p type well region (pw) 230-1 may also be formed in the p type substrate 240. An n+ type diffusion region 250-1 and a p+ type diffusion region 235-1 may be formed in the first p-type well region (pw) 230-1. A second p type well region (pw) 230-2 may also be formed in the p type substrate 240. An n+ type diffusion region 250-2 and a p+ type diffusion region 235-2 may be formed in the second p-type well region (pw) 230-2.

The n-type well region (nw) 220, the first p type well region (pw) 230-1 and the second p type well region (pw) 230-2 may be arranged laterally with respect to each other along a first major surface of the p type substrate 240. The first p type well region (pw) 230-1 and the second p type well region (pw) 230-2 may each be formed on opposite sides of the n type well region (nw) 220. In other words, the n type well region (nw) 220 is arranged between the first p type well region (pw) 230-1 and the second p type well region (pw) 230-2.

The SCR 110 may consist of four laterally arranged layers of alternating n and p type semiconductor materials to form a p-n-p-n structure. An emitter of the p-n-p transistor 106 may be formed by the p+ type diffusion region 210, a base of the the p-n-p transistor 106 may be formed by the n type well region (nw) 220 and collector of the the p-n-p transistor 106 may be formed by the p-type well region (pw) 230-1 and the p+ diffusion region 235-1. The base of the p-n-p transistor 106 is contacted via the n+ diffusion region 225. An emitter of the n-p-n transistor 108 may be formed by the p+ diffusion region 235-1, a base of the n-p-n transistor 108 may be formed by the p type well region (pw) 230-1 and the p substrate 240 and a collector of the n-p-n transistor 108 may be formed by the n type well region (nw) 220 and the n+ diffusion region 225. The base of the n-p-n transistor 108 is contacted via the p+ region 235-1.

The p-n diode 112 of the ESD device 100 may be formed by the p+ type diffusion region 235-2 formed in the p-type well region (pw) 230-2 and the p substrate 240, which may form an anode of the p-n diode 112, and a n+ type diffusion region 225 formed in the n type well region (nw) 220, which may form a cathode of the p-n diode 112. In this way the p-n diode 112 may be integrally formed with SCR 110 in the substrate 240.

FIG. 6-2 illustrates a multi-finger array comprising an array of devices of the type illustrated in FIG. 6-1, that is an alternating structure of n and p wells each comprising respective n+ and p diffusion regions The p type well regions (pw) connected to a ground terminal (or input) 102, may be considered to have a translational symmetry in the sense that the same structure is repeated. That is, p type well region 230-1 of the first finger may overlap or be identical to the p type well region 230-2 of the next finger. Respectively n+ diffusion region 250-1 of the first finger may overlap or be identical to n+ diffusion region 250-2 of the next finger. The arrangement is such that p type well regions (pw) 230-2 of one finger may be identical to p-type well regions (pw) 230-1 of the next finger. The same is valid for n+ diffusions 250-1 and 250-2 and for p+ diffusions 235-1 and 235-2. This structure may be repeated as necessary.

In case of an array or multi-finger layout, the p+ type diffusion region 235-2 may serve both as base contact for the n-p-n transistor 108 and as anode of the p-n diode 112. Both p+ type diffusion region 235-1 and 235-2 formed in the p-type well regions (pw) 230-1 and 230-2 may be connected to n+ diffusion regions 250-1 and 250-2, to form ground terminal 102 of the ESD device 110. N+ diffusion 225 serves both as base contact for the p-n-p transistor 106 and as cathode of the p-n diode 112. N+ type diffusion region 225 formed in the n type well region 220 may be connected to p+ type diffusion region 210, to form signal terminal (or input) 104 of the ESD device.

FIGS. 7-1 and 7-2 illustrate the function of the device when an over-voltage (or ESD event) is applied at the signal terminal 104 that is positive with respect to the ground terminal 102. In FIGS. 7-1 and 7-2, the SCR 110 may be activated by a positive stress voltage with respect to the ground terminal 102, on the signal terminal 104. Current may flow from p+ diffusion 210 to n+ diffusion 250, as illustrated in FIGS. 7-1 and 7-2. In that way the excessive current on terminal 104 may be drained to ground and the voltage on terminal 104 is limited, in that way protecting any external device that is connected to terminal 104 from overvoltage and overcurrent.

For a negative voltage on the signal terminal 104, with respect to the ground terminal 102, the ESD device 100 operates as a p-n diode between the p+ type diffusion region 235 formed in the p type well region (pw) 230, and the n+ type diffusion region 225 formed in the n type well region (nw) 220. Current will flow from p+ diffusion 235 to n+ diffusion 225, as illustrated in FIGS. 8-1 and 8-2. In that way the excessive current on terminal 104 may be drained to ground and the voltage on terminal 104 is limited, in that way protecting any external device that is connected to terminal 104 from overvoltage and overcurrent.

FIGS. 9-1 and 9-2 illustrate that the SCR and the diode may not share current paths. FIGS. 9-1 and 9-2 are an overlay of FIGS. 7-1, 7-2 and 8-1, 8-2, showing both current path for positive pulses when the SCR is conducting and the current path for negative pulses when the diode is conducting.

The skilled person will see therefore that the current paths for the SCR 110 and the diode 112 are not shared, as also illustrated in FIGS. 7-1, 7-2, 8-1, 8-2 and 9-1, 9-2.

The ESD protection devices 100 may be arranged as arrays of multiple fingers, that is, fingers or regions of alternating conductivity type so that the maximum current robustness (at TLP measurement) per width of finger is typically in the range of 50 to 100 mA per μm width. In order to achieve 30A total current robustness the total width of the array may be in the range of 300 μm to 600 μm. A single device with this total width may not useable due to layout restrictions of device metallisation limiting the maximum total current for a specific metallisation. Therefore several devices may be arranged in parallel to each other comprising for example 5 to 10 fingers each of for example 30 μm to 60 μm width.

When arranging the multiple fingers next to each other it is good practice to minimize the total used area by overlapping similar diffusions by deploying the translation symmetry as discussed above.

The skilled person will appreciate however, that the number of ESD devices 100 in the multi-device array may be chosen depending on the required ESD and capacitance performance, whereby higher ESD performance may be achieved by adding additional ESD devices 100 to the structure, but with the trade-off that this will increase capacitance.

The ESD device or array as discussed above may be incorporated in high data rate interconnections or interfaces such as HDMI, USB, MHL. The ESD device or array may be incorporated by connecting the signal line to the data line of the specific data connection or interface. The ground connection of the ESD device or array may be connected to the respective ground connection of the specific data connection or interface.

Particular and preferred aspects of the invention are set out in the accompanying independent claims. Combinations of features from the dependent and/or independent claims may be combined as appropriate and not merely as set out in the claims.

Whilst the forgoing discussion refers to forming the various p and n type regions by diffusion in a substrate, the skilled person will also appreciate that these regions may be formed by appropriate known epitaxial techniques. In this regard any reference to diffusion does not limit the arrangements described to formation by diffusion alone but also encompasses epitaxial formation alone, or a combination of epitaxy and diffusion. Also any reference to formation of regions in the substrate may also be understood to be at or on the substrate.

Furthermore, whilst the foregoing makes reference to a specific arrangement of p and n type region the skilled person will understand the above arrangements are not limited in this way. In this regard the skilled person that the p type substrate may also be an n type substrate with appropriate reversal of the respective n and p type regions to p and n type regions.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A semiconductor electrostatic discharge protection device, comprising:
    a semiconductor controlled rectifier; and
    a p-n diode;
    wherein the semiconductor controlled rectifier and the diode are integrally arranged laterally at a major surface of a semiconductor substrate; and wherein a current path for the semiconductor controlled rectifier is separate from a current path for the diode.

2. The semiconductor electrostatic discharge protection device of claim 1, the semiconductor controlled rectifier comprising first and second transistors of opposite type, wherein:
    a base and an emitter of the first transistor are arranged as a first input;
    a base and emitter of the second transistor are arranged as a second input; and the diode is connected between the first and second inputs.

3. The semiconductor electrostatic discharge protection device of claim 2, wherein the diode is arranged between the base of the first transistor and the base of the second transistor.

4. The semiconductor electrostatic discharge protection device of claim 1;
    wherein the semiconductor controlled rectifier comprises a first semiconductor region having a first conductivity type and a second semiconductor region having a second conductivity type opposite to the first conductivity type; and wherein the p-n diode comprises the second semiconductor region and a third semiconductor region having a first conductivity type.

5. The semiconductor electrostatic discharge protection device of claim 4, wherein first semiconductor region, second semiconductor region and third semiconductor region each comprise respective first and second doped regions of opposite conductivity type.

6. The semiconductor electrostatic discharge protection device of claim 5, wherein the p-n diode comprises a first doped region of the third semiconductor region and a second doped region of the second semiconductor region.

7. The semiconductor electrostatic discharge protection device of claim 2, wherein the respective first and second doped regions of the first semiconductor region and the respective first and third doped regions of the third semiconductor region comprise the first input, and the respective first and second doped regions of the second semiconductor region comprise the second input.

8. An array of semiconductor electrostatic discharge protection devices according to claim 1, comprising an alternating array of semiconductor controlled rectifiers and diodes integrally laterally arranged on a substrate.

9. The array of semiconductor electrostatic discharge protection devices according to claim 8, wherein the array comprises a lateral arrangement of first and second semiconductor regions of opposing conductivity.

10. The array of semiconductor electrostatic discharge protection devices according to claim 9, wherein respective first and second doped regions of the first semiconductor regions form a first input terminal of the array, and the respective first and second doped regions of the second semiconductor regions form a second input terminal of the array.

11. The array of claim 1, wherein the semiconductor controlled rectifiers further comprise low voltage trigger implants or diffusions.

12. A data transfer line comprising an electrostatic discharge protection device according to claim 1 or an array of electrostatic discharge protection devices.

13. A data interface comprising an electrostatic discharge protection device according to claim 1 or an array of electrostatic discharge protection devices, the array comprising an alternating array of semiconductor controlled rectifiers and diodes integrally laterally arranged on a substrate.

* * * * *